(12) United States Patent
Vautin et al.

(10) Patent No.: US 10,187,722 B2
(45) Date of Patent: Jan. 22, 2019

(54) ENTERTAINMENT AUDIO PROCESSING

(71) Applicant: BOSE CORPORATION, Framingham, MA (US)

(72) Inventors: Jeffrey R. Vautin, Worcester, MA (US); Michael S. Dublin, Arlington, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 16/042,620

(22) Filed: Jul. 23, 2018

(65) Prior Publication Data

US 2018/0332393 A1 Nov. 15, 2018

Related U.S. Application Data

(63) Continuation of application No. 15/225,088, filed on Aug. 1, 2016, now Pat. No. 10,057,681.

(51) Int. Cl.
*H04R 3/04* (2006.01)
*H04S 1/00* (2006.01)
(Continued)

(52) U.S. Cl.
CPC .......... *H04R 3/04* (2013.01); *H03G 3/3005* (2013.01); *H03G 3/3026* (2013.01);
(Continued)

(58) Field of Classification Search
CPC ............ H04R 2430/01; H04R 2420/01; H04R 2499/13; H04R 3/12; H04R 2227/003; H04R 2227/005; H04R 27/00; H04R 29/00; H04R 3/04; H04R 17/00; H04R 1/227; H04R 1/24; H04R 1/26; H04R 1/403;
(Continued)

(56) References Cited

U.S. PATENT DOCUMENTS

| | | | |
|---|---|---|---|
| 4,101,735 | A | 7/1978 | Bridenbaugh |
| 4,748,669 | A | 5/1988 | Klayman |

(Continued)

FOREIGN PATENT DOCUMENTS

| | | |
|---|---|---|
| DE | 3045722 A1 | 6/1982 |
| EP | 2434783 A1 | 3/2012 |
| WO | 2013135559 A1 | 9/2013 |

OTHER PUBLICATIONS

International Search Report and the Written Opinion of the International Searching Authority for International Application No. PCT/US2017/044551 dated Jan. 19, 2018.

(Continued)

*Primary Examiner* — Mohammad Islam

(74) *Attorney, Agent, or Firm* — Patterson + Sheridan, LLP

(57) ABSTRACT

An entertainment audio processing system includes a music limiter configured to receive an audio signal, volume control information for music, and volume control information for announcement. The music limiter is further configured to calculate a gain parameter based on a music-to-announcement ratio. In another aspect, an entertainment audio processing system includes a mixer configured to substantially match a left audio signal channel and a right audio signal channel. The entertainment audio processing system further includes an equalizer configured to introduce magnitude and phase changes between the left audio signal channel and the right audio signal channel.

20 Claims, 6 Drawing Sheets

(51) Int. Cl.
*H03G 3/30* (2006.01)
*H03G 5/16* (2006.01)

(52) U.S. Cl.
CPC .............. *H03G 5/165* (2013.01); *H04S 1/002* (2013.01); *H03G 2201/307* (2013.01); *H04R 2499/13* (2013.01); *H04S 2400/13* (2013.01)

(58) Field of Classification Search
CPC ............ B60R 2300/302; B60R 25/257; B60R 16/0373; B60R 25/33; G06F 3/165; G06F 3/167; G06F 17/30867; G06F 17/2785; G10L 15/22; G10L 15/02; G10L 15/197; G10L 25/51; G10L 15/265; G10L 17/22; G10L 2015/088; G10L 25/48; G10L 2015/228
See application file for complete search history.

(56) References Cited

U.S. PATENT DOCUMENTS

| | | |
|---|---|---|
| 5,438,689 A | 8/1995 | Kluth |
| 6,868,385 B1 | 3/2005 | Gerson |
| 9,392,366 B1 | 7/2016 | Meyer et al. |
| 9,615,170 B2 | 4/2017 | Kirsch et al. |
| 2005/0190903 A1 | 9/2005 | Viikki |
| 2005/0192805 A1 | 9/2005 | Kudoh |
| 2006/0190903 A1 | 8/2006 | Koo |
| 2007/0071206 A1 | 3/2007 | Gainsboro et al. |
| 2007/0213092 A1 | 9/2007 | Geelen |
| 2008/0025530 A1 | 1/2008 | Romesburg |
| 2008/0212820 A1 | 9/2008 | Park |
| 2009/0061837 A1 | 3/2009 | Chaudhri et al. |
| 2010/0322429 A1 | 12/2010 | Norvell et al. |
| 2011/0182283 A1 | 7/2011 | Van Buren et al. |
| 2012/0114127 A1 | 5/2012 | Yamashita et al. |
| 2012/0170756 A1 | 7/2012 | Kraemer et al. |
| 2012/0215716 A1 | 8/2012 | Shier, Jr. et al. |
| 2012/0253823 A1 | 10/2012 | Schalk et al. |
| 2012/0294461 A1 | 11/2012 | Maeda et al. |
| 2013/0339031 A1 | 12/2013 | Yoon et al. |
| 2014/0172990 A1 | 6/2014 | Wan et al. |
| 2014/0355765 A1 | 12/2014 | Kulavik et al. |
| 2015/0358725 A1 | 12/2015 | Hera et al. |
| 2015/0358730 A1 | 12/2015 | Kirsch et al. |
| 2015/0365764 A1 | 12/2015 | Yamamoto |
| 2015/0382096 A1 | 12/2015 | Lamar et al. |
| 2018/0035205 A1 | 2/2018 | Vautin et al. |

OTHER PUBLICATIONS

Invitation to Pay Additional Fees for International Application No. PCT/US2017/044551 dated Oct. 20, 2017.
U.S. Appl. No. 14/791,758, "Simulating Acoustic Output at a Location Corresponding to Source Position Data", filed Jul. 6, 2015, 18 pages.

ENTERTAINMENT AUDIO PROCESSING

CROSS-REFERENCE TO RELATED APPLICATIONS

This application is a continuation of co-pending U.S. patent application Ser. No. 15/225,088, filed Aug. 1, 2016. The aforementioned patent application is herein incorporated by reference in its entirety.

FIELD OF THE DISCLOSURE

The present disclosure relates in general to audio systems, and more particularly, to managing vehicular audio sources.

BACKGROUND

Many vehicle types include announcement audio to communicate information to a driver. For example, announcement audio may include navigation system audio instructions, vehicle chimes, enunciated announcements, cell phone alerts, cell phone conversations, and other non-entertainment audio sources. It can be difficult to hear with clarity an incoming announcement audio when an entertainment audio is already playing in an audio system.

SUMMARY

All examples and features mentioned below can be combined in any technically possible way.

In one aspect, an apparatus includes a music limiter configured to receive an audio signal, volume control information for music, and volume control information for announcement. In a particular implementation, the music limiter is configured to calculate a gain parameter based on a music-to-announcement ratio. The music-to-announcement ratio is an indication of how much quieter or louder a music relative to an announcement. The music-to-announcement ratio may be based on an application. The application corresponds to various make and model of different type of vehicles.

In another aspect, an apparatus includes a mixer configured to substantially match a left audio signal channel and a right audio signal channel. The mixer is coupled to an equalizer. The equalizer is configured to introduce magnitude and phase differences between the left audio signal channel and the right audio signal channel. According to a particular implementation, the apparatus includes a music limiter configured to receive volume control information for music and volume control information for announcement. The music limiter is configured to calculate a gain parameter based on a music-to-announcement ratio.

In another aspect, a method includes receiving an audio signal. The audio signal includes at least one of an audio music signal and an audio announcement signal. In a particular implementation, the method includes adjusting a level of the audio music signal relative to a level of the audio announcement signal based on a music-to-announcement ratio. The music-to-announcement ratio indicates how much quieter or louder a music audio is relative to an announcement audio. According to another particular implementation, the method includes performing spatial signal processing in response to adjusting the level of the audio music signal relative to the level of the audio announcement signal. The spatial signal processing includes substantially matching a left audio signal channel and a right audio signal channel. In a particular implementation, the method includes introducing magnitude and phase differences between the left audio signal channel and the right audio signal channel.

DETAILED DESCRIPTION

An audio system of a vehicle plays entertainment audio, such as music and/or television (TV) or radio programs that are pre-recorded or live. Occasionally, the audio system initiates an audio announcement to be played over ongoing music or other entertainment audio. An implementation of the system automatically adjusts a level of a music audio signal relative to and in response to a level of an announcement audio signal. The automatic adjustment enhances an ability of a listener to focus, clearly hear, distinguish, or understand the announcement audio, e.g., without having to mute the entertainment audio.

The audio system includes an entertainment audio processing system that focuses listener attention to the announcement audio instead of the music audio. For example, the entertainment audio processing system adjusts the level of the audio music signal relative to the level of the audio announcement signal based on a music-to-announcement ratio. The music-to-announcement ratio indicates how much quieter or louder the audio music signal is relative to the audio announcement signal. The music-to-announcement ratio is associated with one or more applications. For instance, the applications correspond to the make and model of different type of vehicles.

In different examples, the music-to-announcement ratio is tuned at a manufacturer of the entertainment audio processing system, a manufacturer of the vehicle, or by a listener. The entertainment audio processing system may include one or more knobs used to tune or optimize the music-to-announcement ratio. A listener may adjust, readjust, and save a tuned music-to-announcement ratio. The entertainment audio processing system uses the saved music-to-announcement ratio when an announcement is present.

The entertainment audio processing system introduces spatial changes to an audio music signal to focus attention to the announcement audio, instead of the music audio. The spatial changes include matching a left audio signal channel and a right audio signal channel. The spatial changes further include introducing magnitude and phase differences between the left audio signal channel and the right audio signal channel. In this manner, downstream processors render output audio signals associated with the audio musical signal differently in space. Thus, an early introduction (or application) of the spatial changes on a signal path may change what a downstream processor would subsequently perform without directly changing properties of the one or more downstream processors.

Various illustrative implementations of an entertainment audio processing system are illustrated herein. However, the various illustrative implementations are not to be regarded as exhaustive implementations of the entertainment audio processing system disclosed in this application.

Figure 1:
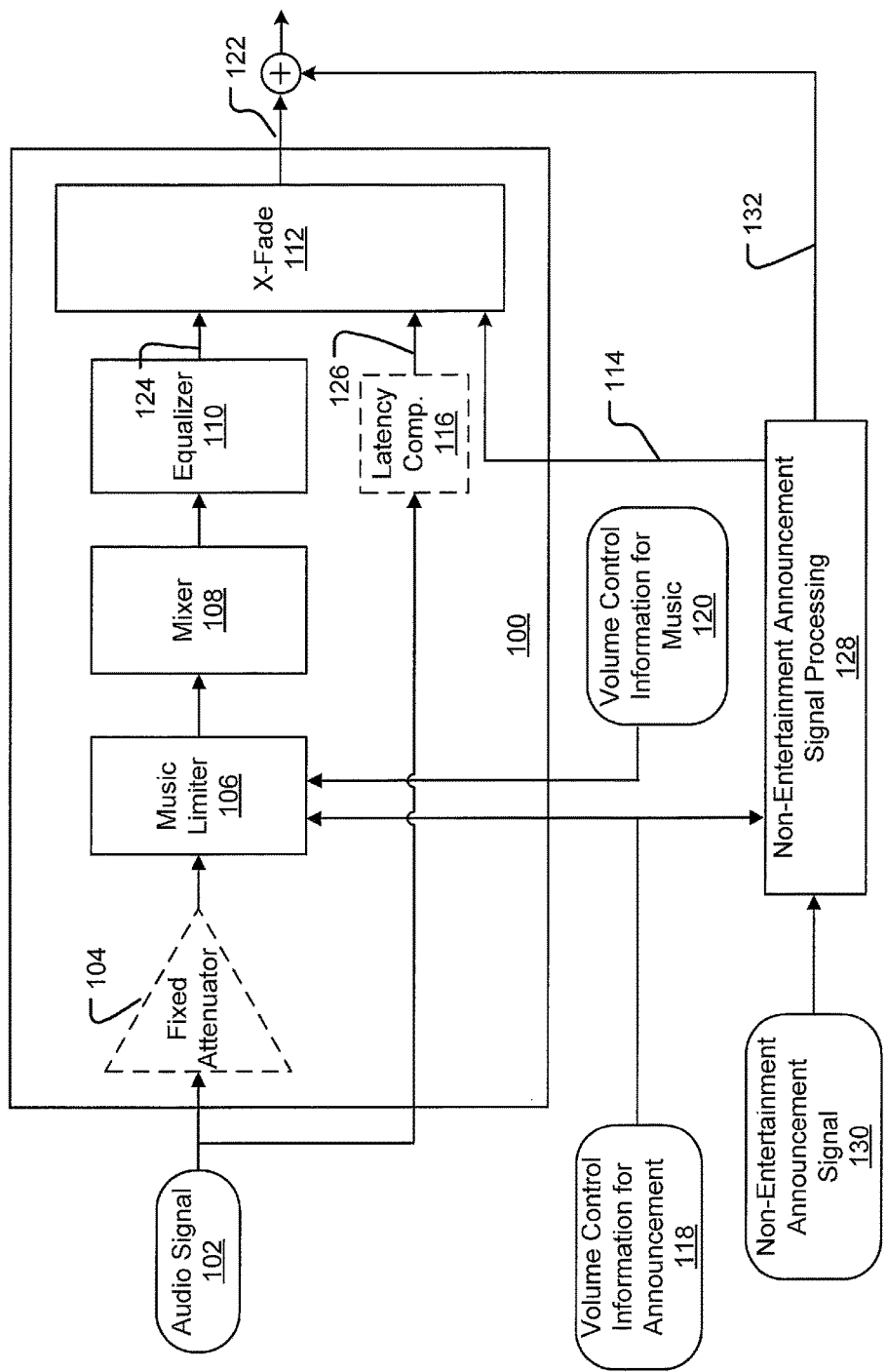
FIG. 1 is a block diagram of an illustrative implementation of an entertainment audio processing system.

FIG. 1 depicts an entertainment audio processing system 100. The entertainment audio processing system 100 includes a music limiter 106. The music limiter 106 attenuates (or reduces) an audio signal 102. The audio signal 102 received by the music limiter 106 includes at least one of an audio music signal. An illustrative audio signal 102 corresponds to an entertainment audio (e.g., music audio), and a separate, audio announcement signal 115 pertains to a navigation system audio instruction or an incoming cell phone call. The music limiter 106 attenuates the audio music signal to maintain a desired music-to-announcement ratio. The music-to-announcement ratio indicates how much quieter or louder the music audio is relative to the announcement audio. The music-to-announcement ratio is based on one or more applications, such as the make and model of different vehicle types.

FIG. 1 additionally shows non-entertainment audio processing circuitry 128 that processes a non-entertainment audio signal 130 to generate a processed non-entertainment audio signal 132. The processed entertainment (e.g., music) audio signal 122 is combined downstream with the processed non-entertainment audio signal 132. The entertainment audio processing system 100 of FIG. 1 works in parallel with non-entertainment audio processing circuitry (not shown), such as that described in U.S. patent application Ser. No. 14/791,758, entitled "SIMULATING ACOUSTIC OUTPUT AT A LOCATION CORRESPONDING TO SOURCE POSITION DATA," filed Jul. 6, 2015.

The music limiter 106 calculates a gain parameter based on the music-to-announcement ratio. The gain parameter is applied to the audio music signal so that the music audio is a number of decibels (dBs) quieter or louder than the announcement audio. The music limiter 106 of an example actively adjusts the level of the audio music signal relative to the level of the audio announcement signal based on volume control information for announcements and music 118, 120. For instance, the music-to-announcement ratio is dynamically adjusted based on a change in the volume control information for an announcement 118 and music 120.

For example, when a particular make and model of a vehicle is determined to have a desirable music-to-announcement ratio of 10 dB (i.e., the music audio is 10 dB quieter than the announcement audio) and upon a determination by the music limiter 106 that the attenuation of the audio music signal relative to the audio announcement signal is only 5 dB, the music limiter 106 further attenuates the audio music signal by 5 dB so that the music-to-announcement ratio is approximately 10 dB. In another example, the music limiter 106 performs no attenuation when it is determined that the attenuation of the audio music signal relative to the audio announcement signal is already greater than or equal to 10 dB. Thus, the music limiter 106 enables the entertainment audio processing system 100 to maintain a particular music-to-announcement ratio. According to a particular implementation, the music-to-announcement ratio may correspond to a value ranging from 6 dB to 10 dB. The 6 dB to 10 dB range may be associated with an optimum value applicable to a majority of various vehicular makes and models.

According to another particular implementation, the music limiter 106 stores a plurality of previously calculated music-to-announcement ratios. The music limiter 106 determines a gain parameter based on the plurality of previously calculated music-to-announcement ratios. The music limiter 106 applies the gain parameter to an audio music signal so that a music audio is a number of dBs quieter than an announcement audio. The previously calculated music-to-announcement ratios enables the music limiter 106 to predict what level an audio announcement signal should be at when a particular announcement comes back. The music limiter 106 may correspond to a dynamic range limiter or attenuator.

An implementation of the entertainment audio processing system 100 includes a mixer 108 and an equalizer 110. The mixer 108 and the equalizer 110 enable a change of spatial perception of an audio music signal to a listener. With the change of spatial perception, focus is deviated from the music audio to the announcement audio. The mixer 108 partially or completely collapses an audio music signal to mono by making a left audio music signal and a right audio music signal similar to each other. For example, the mixer 108 corresponds to a matrix with a tunable attenuation on S-component. An algorithm associated with the mixer 108 utilizes the following equations:

$$L\_out = (2-G)/2 * L\_in + G/2 * R\_in$$

$$R\_out = (2-G)/2 * R\_in + G/2 * L\_in$$

where G=0 produces stereo, G=1 yields mono, and continuously varies between the two possible values of G.

The equalizer 110 introduces, or inserts, magnitude and phase differences between the left audio music signal and the right audio music signal. A magnitude and phase of the left audio music signal is varied relative to a magnitude and phase of the right audio music signal. A result of the introduced magnitude and phase differences is energy of the audio music signal that is distributed across all of one or more downstream processors outputs. A resulting output sound of a speaker is evenly spread around the listener. The introduced magnitude and phase differences may correspond to values determined by the manufacturer of the entertainment audio processing system or the vehicle. According to a particular implementation, the introduced magnitude and phase differences are optimized or tuned for a particular vehicle or a particular application. The equalizer 110 may correspond to a two-channel full-rate finite impulse response (FIR). In FIG. 1, the music limiter 106 is positioned in sequence before the mixer 108 and the equalizer 110. Alternatively, the processes of the music limiter 106 may occur subsequent to those of the mixer 108 and the equalizer 110.

The entertainment audio processing system 100 of FIG. 1 includes an x-fade 112. The x-fade 112 determines whether to select a processed audio signal 124 or an unprocessed audio signal 126 based on an announcement trigger signal 114 initiated by the non-entertainment audio processing circuitry 128. The announcement trigger signal 114 provides an indication to the entertainment audio processing system 100 that an announcement audio is present. The announcement trigger signal 114 is output by a system responsible for generating the announcement audio.

The processed audio signal 124 corresponds to the audio signal 102 that is processed by at least one of the music limiter 106, the mixer 108, and the equalizer 110. The unprocessed audio signal 126 corresponds to an output signal of a latency compensator 116. The latency compensator 116 introduces a time delay that matches a time delay associated with the processed audio signal 124. The time delay associated with the processed audio signal 124 is due to at least one of the music limiter 106, the mixer 108, the equalizer 110, or a fixed attenuator 104. Thus, the x-fade 112 enables a gradual change of an digital audio signal 122 so that a listener will not notice an abrupt change to the level of the audio music signal relative to the level of the audio announcement signal. The downstream processor(s) receive the digital audio signal 122 and render output audio signals associated with the digital audio signal 122 differently in space.

According to a particular implementation, the entertainment audio processing system 100 includes the fixed attenuator 104. The fixed attenuator 104 attenuates the audio music signal by a fixed amount of dBs to signal a mode change to a listener. For example, the fixed attenuator 104 may further attenuate the level of the audio music signal corresponding to a music-to-announcement ratio that is particular to an application. According to a particular implementation, the entertainment audio processing system 100 may be implemented by a processor (e.g., a DSP).

Figure 2:
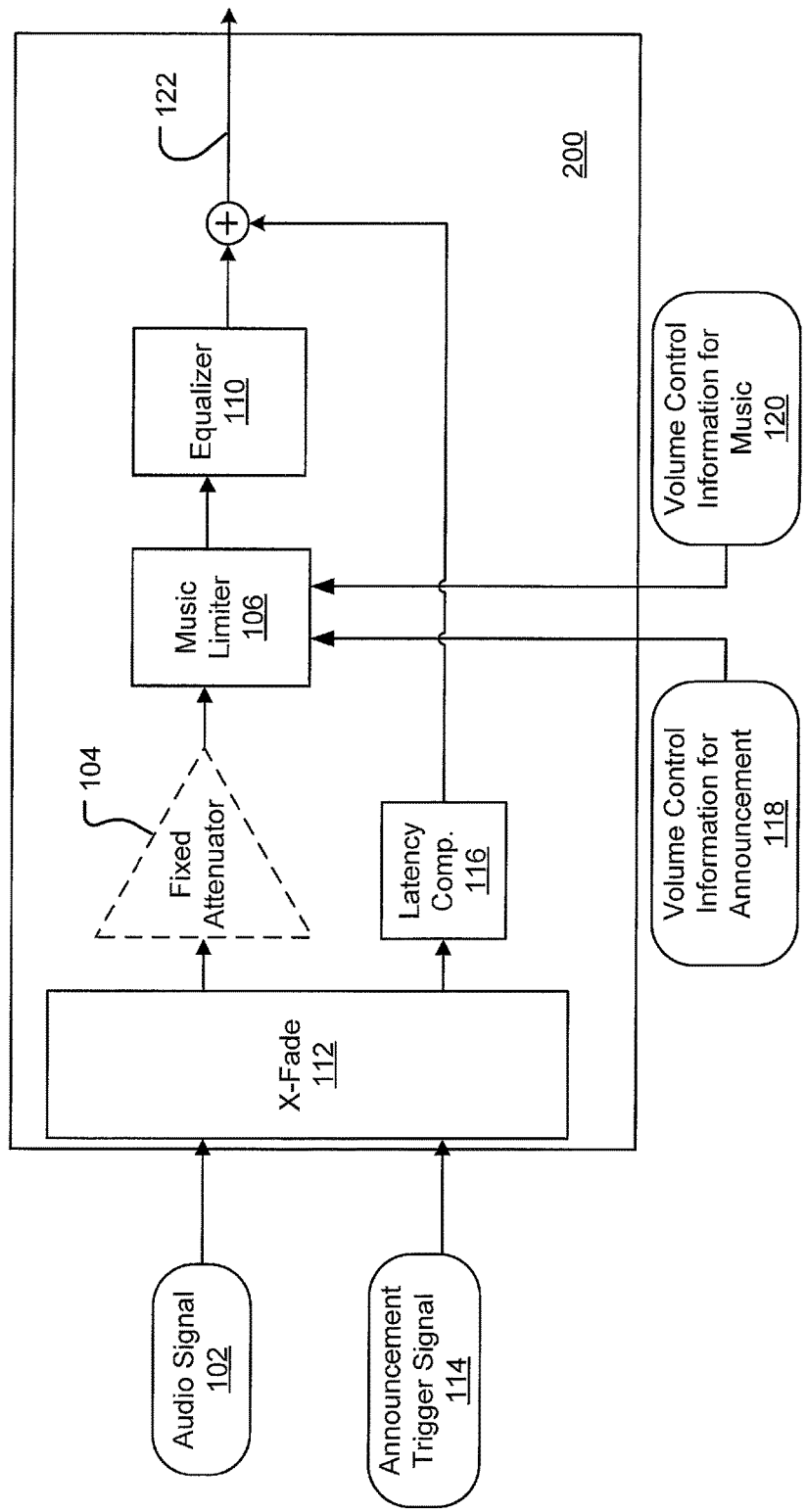
FIG. 2 is a block diagram of an illustrative implementation of an entertainment audio processing system similar to that of FIG. 1 and without a mixer.

FIG. 2 depicts another illustrative implementation of an entertainment audio processing system. An entertainment audio processing system 200 includes one or more elements associated with the entertainment audio processing system 100 of FIG. 1. In this configuration, the X-fade 112 selects between a latency adjusted output of the x-fade 112 and the processed output of the x-fade (i.e., as processed by the fixed attenuator 104, the music limiter 106, and the equalizer 110).

Figure 3:
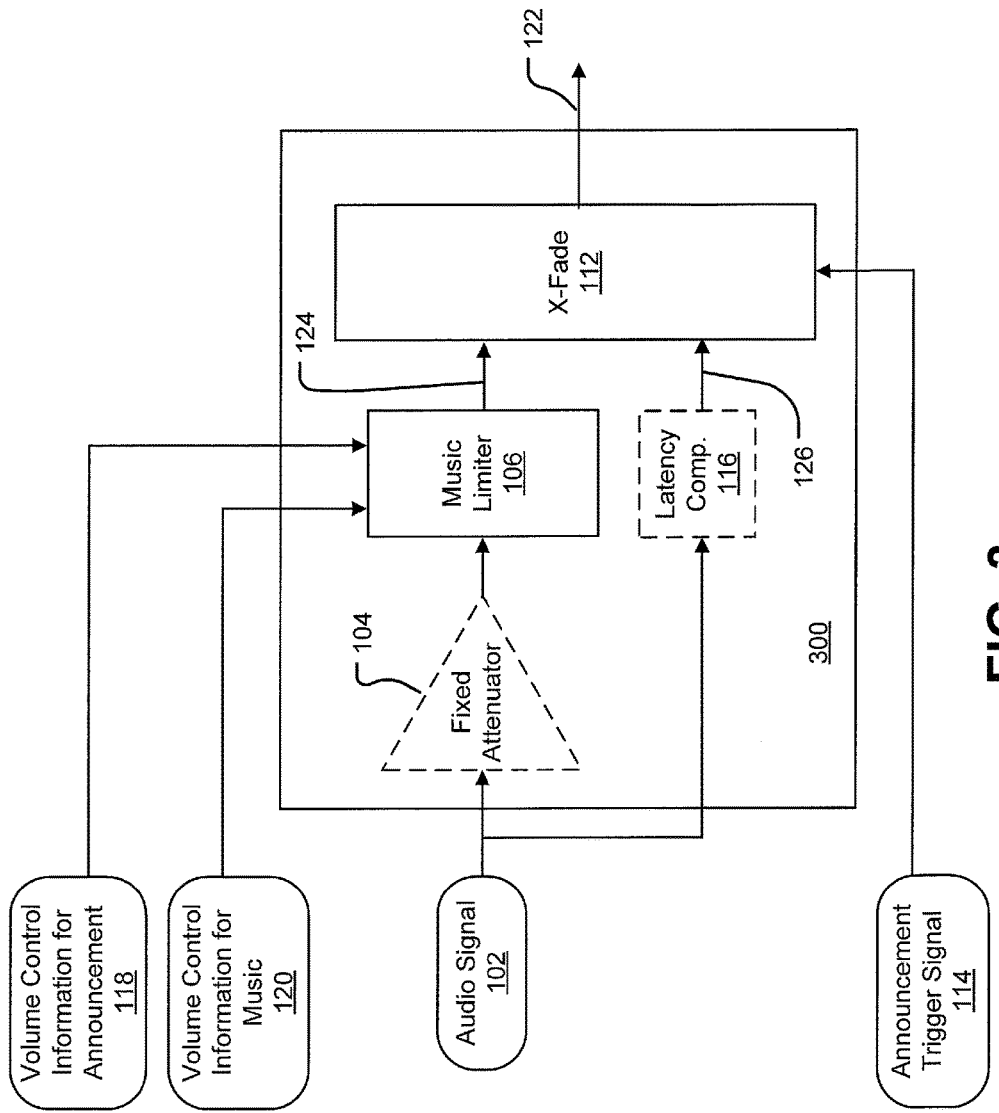
FIG. 3 is a block diagram of another illustrative implementation of an entertainment audio processing system.

FIG. 3 depicts another illustrative implementation of an entertainment audio processing system. An entertainment audio processing system 300 includes one or more elements associated with the entertainment audio processing system 100 of FIG. 1. However, as illustrated in FIG. 3, one or more elements associated with the entertainment audio processing system 100 of FIG. 1 are not included in the entertainment audio processing system 300. For instance, the system 300 of FIG. 3 does not include a mixer or a equalizer.

Figure 4:
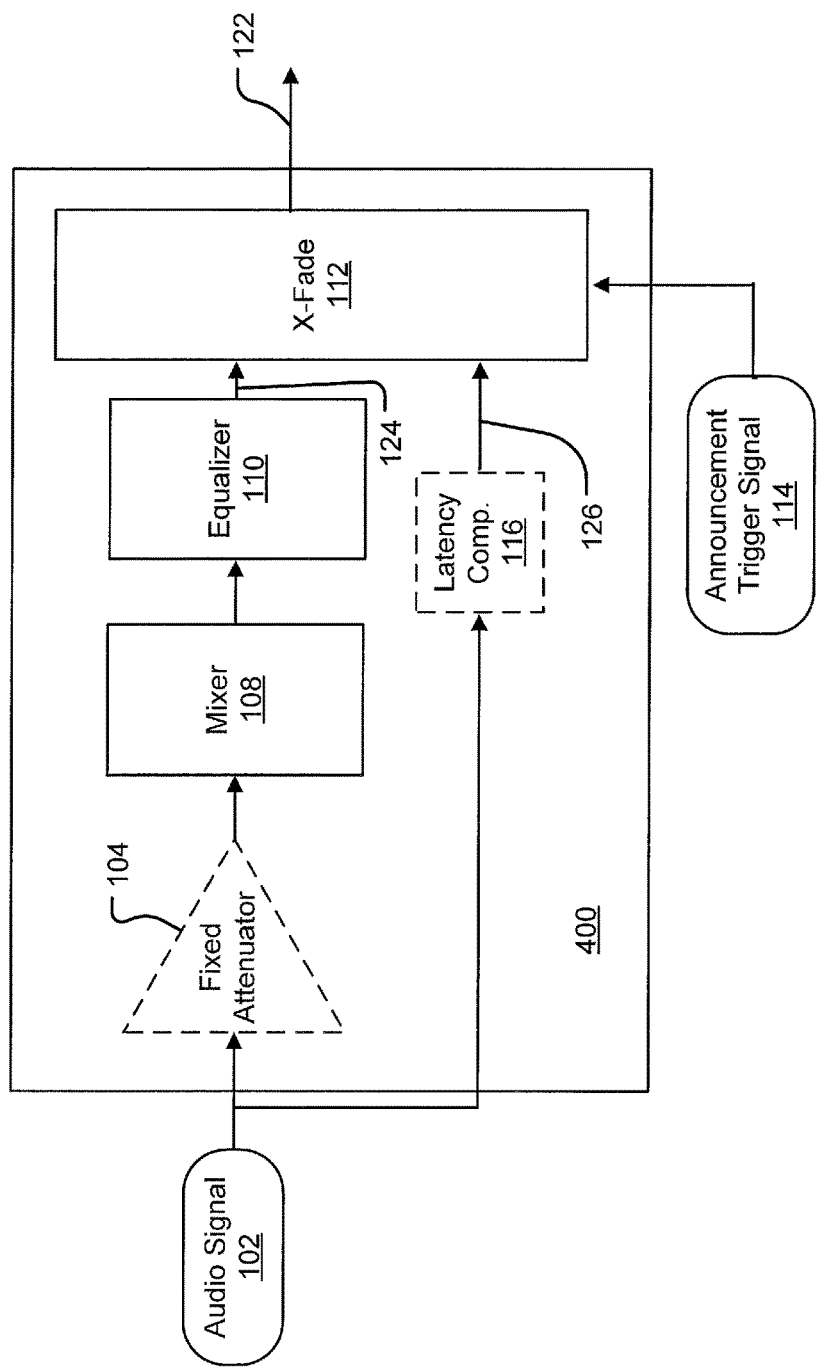
FIG. 4 is a block diagram of another illustrative implementation of an entertainment audio processing system.

FIG. 4 depicts another illustrative implementation of an entertainment audio processing system. An entertainment audio processing system 400 includes one or more elements associated with the entertainment audio processing system 100 of FIG. 1. However, as illustrated in FIG. 4, one or more elements associated with the entertainment audio processing system 100 of FIG. 1 are not included in the entertainment audio processing system 400. For example, the system 400 of FIG. 4 does not include a music limiter or volume control information.

Figure 5:
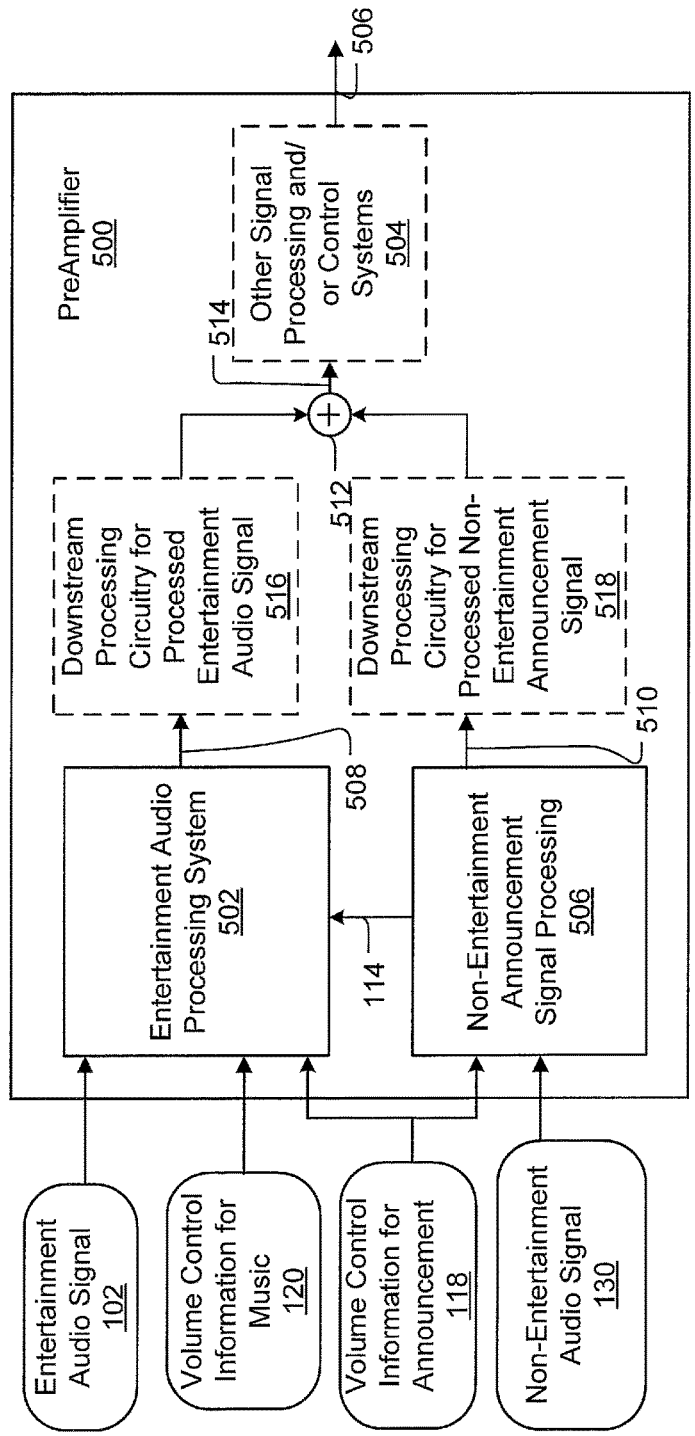
FIG. 5 is block diagram of an illustrative implementation of an entertainment audio processing system included in a pre-amplifier module.

FIG. 5 depicts another illustrative implementation of an entertainment audio processing system. An entertainment audio processing system 502 is included in a pre-amplifier module 500. The entertainment audio processing system 502 may correspond to one of the entertainment audio processing systems 100, 200, 300, 400 of FIG. 1-4. A processed entertainment audio signal 508 may correspond to the digital audio signal 122 of FIGS. 1-4. The processed entertainment audio signal 508 of the entertainment audio processing system 502 is output to other signal processing and/or control systems 504. An output signal 506 of the other signal processing and/or control systems 504 is input to one or more downstream processors of an audio system.

FIG. 5 additionally shows non-entertainment audio processing circuitry 506. The respective outputs of the entertainment audio signal processing circuitry 502 and the non-entertainment audio signal processing circuitry 506 is summed together upstream of the other signal processing and/or control systems 504. The processed entertainment audio signal 508 may be combined with the processed non-entertainment audio 510 at 512. The combined signal 514 may be subjected to downstream processing 504. The downstream processing 504 may include, for example, upmixing the output signal into a number of signal components.

Alternatively or additionally, the processed entertainment audio signal 508 and the processed non-entertainment audio signal 510 may be subjected, respectively, to downstream processing circuitry 516 and 518 before they are combined at 512. That is, downstream processing may be performed on the processed entertainment audio signal 508 and the processed non-entertainment audio signal 510, individually, as an alternative to or in addition to the downstream processing of the combined signal at block 504.

Figure 6:
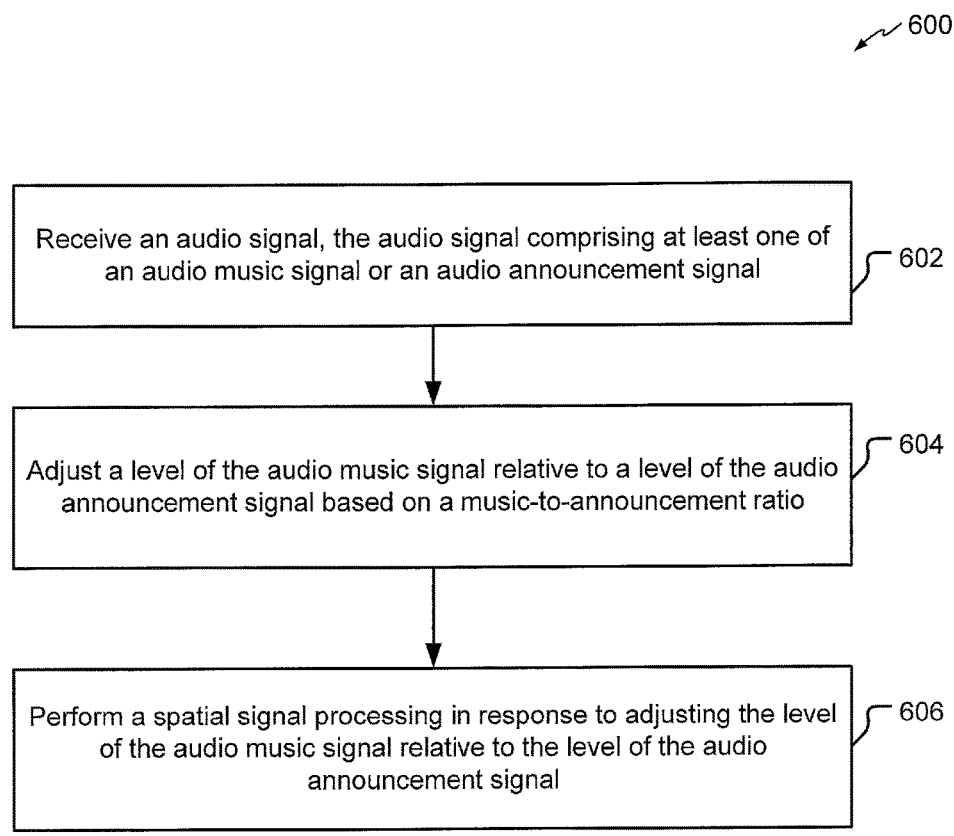
FIG. 6 is a flowchart of an illustrative implementation of a method for an entertainment audio processing system.

FIG. 6 depicts a flowchart diagram representing an implementation of a method 600 for an entertainment audio processing system. The method 600 may be implemented in one of the entertainment audio processing systems 100, 200, 300, 400 of FIG. 1-4 or the entertainment audio processing system 502 of FIG. 5. In one aspect, the method 600 is implemented in a digital signal processor.

The method 600 includes, at 602, receiving an audio signal. For example, the fixed attenuator 104 of FIGS. 1-4 receives the audio signal. In another example, the music limiter 106 of FIGS. 1 and 3 receives the audio signal. In another example, the mixer 108 of FIG. 4 receives the audio signal. In another example, the x-fade 112 of FIG. 2 receives the audio signal. The audio signal includes at least one of an audio music signal or an audio announcement signal.

The method 600 includes, at 604, adjusting a level of the audio music signal relative to a level of the audio announcement signal based on a music-to-announcement ratio. For example, the music limiter 106 of FIGS. 1-3 adjusts the level of the audio music signal relative to the level of the audio announcement signal.

The method 600 includes, at 606, performing a spatial signal processing in response to adjusting the level of the audio music signal relative to the level of the audio announcement signal. For example, the mixer 108 and the equalizer 110 of FIGS. 1, 2, and 4 perform the spatial signal processing in response to adjusting the level of the audio music signal relative to the level of the audio announcement signal.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a DSP, a microcontroller, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed one or more processing devices at one site or distributed across multiple sites and interconnected by a network.

Actions associated with implementing all or part of the functions can be performed by one or more programmable processors or processing devices executing one or more computer programs to perform the functions of the processes described herein. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Those skilled in the art may make numerous uses and modifications of and departures from the specific apparatus and techniques disclosed herein without departing from the inventive concepts. For example, selected implementations of an entertainment audio processing system in accordance with the present disclosure may include all, fewer, or different components than those described with reference to one or more of the preceding figures. The disclosed implementations should be construed as embracing each and every novel feature and novel combination of features present in or possessed by the apparatus and techniques disclosed herein and limited only by the scope of the appended claims, and equivalents thereof.

The invention claimed is:

1. An apparatus comprising:
an entertainment audio processing system comprising:
a music limiter configured to:
receive an unprocessed audio signal, volume control information for music, and volume control information for announcement;
calculate a gain parameter based on a music-to-announcement ratio
apply the gain parameter to the unprocessed audio signal; and
output a modified audio signal that includes the applied gain parameter, wherein the modified audio signal include a left audio signal channel and a right audio signal channel;
a mixer coupled to an output of the music limiter, the mixer configured to at least partially collapse the modified audio signal to mono by making the left audio signal channel and the right audio signal channel similar;
an equalizer coupled to an output of the mixer, the equalizer configured to introduce magnitude and phase differences between the left audio signal channel and the right audio signal channel to generate a processed audio signal;
a latency compensator configured to receive the unprocessed audio signal and introduce a time delay that matches a time delay associated with the processed audio signal to generate a time-delayed audio signal; and
an x-fade coupled to an output of the equalizer and an output of the latency compensator, the x-fade configured to select to output one of the processed audio signal or the time-delayed audio signal based, at least in part, upon an announcement trigger signal received from a non-entertainment audio processing system.

2. The apparatus of claim 1, wherein:
the announcement trigger signal provides an indication to the entertainment audio processing system that an announcement audio is present.

3. The apparatus of claim 1, wherein the music-to-announcement ratio is an indication of how much quieter or louder the music is relative to the announcement.

4. The apparatus of claim 3, wherein the music-to-announcement ratio is based on a particular application.

5. The apparatus of claim 1, wherein an application of the gain parameter to the unprocessed audio signal corresponds to an adjustment of signal level of the music relative to signal level of the announcement.

6. The apparatus of claim 1, wherein the music limiter is further configured to dynamically adjust the music-to-announcement ratio based on a change in the volume control information for the music and a change in the volume control information for the announcement.

7. The apparatus of claim 1, wherein the magnitude and phase differences are based on a particular application.

8. The apparatus of claim 1, further comprising a fixed attenuator coupled to an input of the music limiter and configured to reduce a level of the unprocessed audio signal based on a particular amount.

9. The apparatus of claim 1, further comprising a combiner coupled to an output of the x-fade and an output of the non-entertainment audio processing system, the combiner configured to combine the selected one of the processed audio signal and the time-delayed audio signal with a processed non-entertainment audio signal.

10. An apparatus comprising:
an entertainment audio processing system comprising:
a mixer configured to receive an unprocessed audio signal and at least partially collapse the audio signal to mono by making a left audio signal channel and a right audio signal channel similar;
an equalizer coupled to an output of the mixer, the equalizer configured to introduce magnitude and phase differences between the left audio signal channel and the right audio signal channel to generated a processed audio signal;
a music limiter coupled to an output of the equalizer, the music limiter configured to:
calculate a gain parameter based on a music-to-announcement ratio; and
generate a processed audio signal based, at least in part, on the gain parameter;
a latency compensator configured to receive the unprocessed audio signal and introduce a time delay that matches a time delay associated with the processed audio signal to generate a time-delayed audio signal; and
an x-fade coupled to an output of the music limiter and an output of the latency compensator, the x-fade configured to select to output one of the processed audio signal or the time-delayed audio signal based, at least in part, upon an announcement trigger signal received from a non-entertainment audio processing system.

11. The apparatus of claim 10, wherein:
the announcement trigger signal provides an indication to the entertainment audio processing system that an announcement audio is present.

12. The apparatus of claim 10, wherein the magnitude and phase differences are based on a particular application.

13. The apparatus of claim 10, wherein each of the left audio signal channel and the right audio signal channel comprises at least one of an audio music signal or an audio announcement signal.

14. A non-transitory machine-readable storage medium having instructions stored thereon, which, when executed by a processor causes the processor to:
  receive an unprocessed audio signal, volume control information for music, and volume control information for announcement;
  calculate a gain parameter based on a music-to-announcement ratio;
  apply the gain parameter to the unprocessed audio signal; and
  output a modified audio signal that includes the applied gain parameter, wherein the modified audio signal includes a left audio signal channel and a right audio signal channel;
  at least partially collapse the modified audio signal to mono by making the left audio signal channel and the right audio signal channel similar;
  introduce magnitude and phase differences between the left audio signal channel and the right audio signal channel to generated a processed audio signal;
  introduce a time delay that matches a time delay associated with the processed audio signal to generate a time-delayed audio signal; and
  select to output one of the processed audio signal or the time-delayed audio signal based, at least in part, upon an announcement trigger signal received from a non-entertainment audio processing system.

15. The non-transitory machine-readable storage medium of claim 14, wherein:
  the announcement trigger signal provides an indication to processor that an announcement audio is present.

16. The non-transitory machine-readable storage medium of claim 14, wherein the music-to-announcement ratio is an indication of how much quieter or louder the music is relative to the announcement.

17. The non-transitory machine-readable storage medium of claim 14, wherein an application of the gain parameter to the audio signal corresponds to an adjustment of signal level of the music relative to signal level of the announcement.

18. The non-transitory machine-readable storage medium of claim 14, further comprising instructions to:
  dynamically adjust the music-to-announcement ratio based on a change in the volume control information for the music and a change in the volume control information for the announcement.

19. The non-transitory machine-readable storage medium of claim 14, further comprising instructions for:
  combining the selected one of the processed audio signal and the time-delayed audio signal with a processed non-entertainment audio signal.

20. The non-transitory machine-readable storage medium of claim 14, wherein music-to-announcement ratio corresponds to a value ranging from 6 dB to 10 dB.

* * * * *